United States Patent
Kushihara (10) Patent No.: US 6,278,388 B1
(45) Date of Patent: Aug. 21, 2001

(54) METHOD OF CONVERTING AN ANALOG SIGNAL TO DIGITAL SIGNAL BY DIGITALIZING ERROR DEVIATION

(75) Inventor: Hiroshi Kushihara, Nagano-ken (JP)

(73) Assignee: Tamagawa Seiki Kabushiki Kaisha, Nagano-ken (JP)

(*) Notice: Subject to any disclaimer, the term of this patent is extended or adjusted under 35 U.S.C. 154(b) by 0 days.

(21) Appl. No.: 09/396,454

(22) Filed: Sep. 15, 1999

(30) Foreign Application Priority Data

Jun. 11, 1999 (JP) .................................................. 11-165370

(51) Int. Cl.$^7$ .................................................. H03M 1/48
(52) U.S. Cl. .................................................. 341/112; 341/116
(58) Field of Search .................................................. 341/112, 116, 341/5, 6; 318/605, 685; 331/12; 348/538; 340/870; 342/459; 381/309

(56) References Cited

U.S. PATENT DOCUMENTS

| | | | |
|---|---|---|---|
| 5,079,549 | * 1/1992 | Liessner | 341/116 |
| 5,189,353 | * 2/1993 | Ezuka | 318/605 |
| 5,796,357 | * 8/1998 | Kushihara | 341/116 |
| 5,949,359 | * 9/1999 | Vlahu | 341/116 |

* cited by examiner

Primary Examiner—Patrick Wamsley
(74) Attorney, Agent, or Firm—Sughrue, Mion, Zinn, Macpeak & Seas, PLLC (57) ABSTRACT

It is an object of this invention to provide a digital conversion method for an analog signal in which, when $\sin(\theta-\phi)$ is calculated as a error deviation $\epsilon$, a first output signal $\sin(\theta-\phi)\cdot f(t)$ of the previous stage of the error deviation $\epsilon$ is converted into a digital signal by positive/negative sign determination performed by a comparator to make almost circuits into digital circuits, thereby making it easy to form an IC. In the digital conversion method for an analog signal according to the invention, $\sin(\theta-\phi)\cdot f(t)$ obtained by guiding the rotation detection signal to a multiplier and operating the rotation detection signal is converted into a digital signal by positive/negative sign determination performed by a comparator to achieve a stable and inexpensive configuration.

24 Claims, 11 Drawing Sheets

CLOCK (CYCLE : ΔT)

METHOD OF CONVERTING AN ANALOG SIGNAL TO DIGITAL SIGNAL BY DIGITALIZING ERROR DEVIATION

BACKGROUND OF THE INVENTION

1. Field of the Invention

The present invention relates to a digital conversion method for an analog signal and, more particularly, to an improvement in conversion performances (stability, high-speed performance, and noise resistance) by converting a first output signal $\sin(\theta-\phi)\cdot f(t)$ into a digital signal by positive/negative sign determination performed by a comparator when $\sin(\theta-\phi)$ is calculated as an error deviation $\epsilon$ and a novel improvement for advantaging formation of a monolithic IC by reducing analog circuits in number.

2. Description of the Related Art

Figure 1:
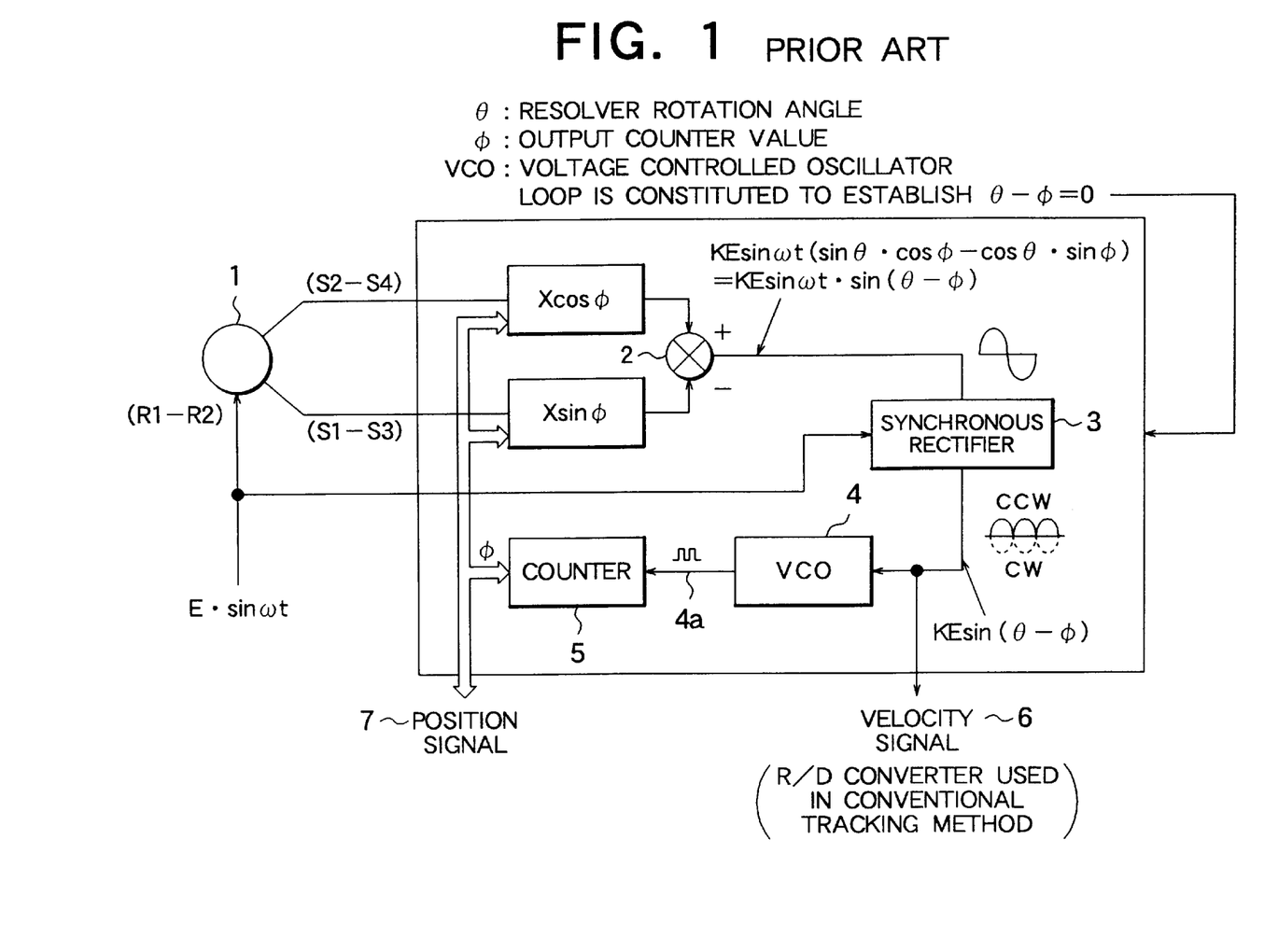
FIG. 1 is a block diagram of a conventional configuration.

As a conventionally used digital conversion method for an analog signal of this type, for example, a tracking method shown in FIG. 1 is popularly used. More specifically, as shown in FIG. 1, reference numeral 1 denotes a resolver excited by an exciting signal (i.e., reference signal) $E \cdot \sin \omega t$. Two-phase outputs $KE \sin \theta \sin \omega t$ and $KE \cos \theta \sin \omega t$ output from the resolver 1 are operated by an operation unit 2, and a two-phase output signal $KE \sin wt \sin(\theta-\phi)$ (where $\theta$ is a resolver rotation angle, and $\phi$ is an output counter value) output from the operation unit 2 is synchronously rectified by a synchronous rectifier 3 to which the exciting signal $E \cdot \sin \omega t$ is input.

An output signal $KE \sin(\theta-\phi)$ obtained from the synchronous rectifier 3 is input to a counter 5 as a pulse output $4a$ through a voltage controlled oscillator 4, in order to obtain an output counter value $\phi$ serving as a digital angle output from the counter 5.

The output counter value $\phi$ is fed back, and thus a feed back loop is formed. Therefore, a velocity signal 6 is obtained by the output signal $KE \sin(\theta-\phi)$ from the synchronous rectifier 3, and a position signal 7 can be obtained from the output counter value $\phi$ of the counter 5.

The conventional digital conversion method for an analog signal has the configuration described above, the following problem is posed.

More specifically, since each constituent portion in the circuit configuration described above is partially constituted by a complex analog configuration, the entire configuration cannot be easily formed by an integrated monolithic semiconductor, and an exciting circuit or the like is inevitably added as a discrete part. For this reason, a low price, a reduction in size and weight, high reliability, and utility cannot be easily achieved. In addition, a preferable improvement means for a tracking speed is not found.

SUMMARY OF THE INVENTION

The present invention has been made to solve the above problem, and has as its object to, more particularly, a digital conversion method for an analog signal in which an improvement in conversion performances (stability, high-speed performance, and noise resistance) by converting a first output signal $\sin(\theta-\phi)\cdot f(t)$ into a digital signal by positive/negative sign determination performed by a comparator when $\sin(\theta-\phi)$ is calculated as an error deviation e and an improvement for advantaging formation of a monolithic IC by reducing analog circuits in number.

A digital conversion method for an analog signal according to the present invention is a method for obtaining a digital angle output ($\phi$) from rotation detection signals [$\sin \theta \cdot f(t)$ and $\cos \theta \cdot f(t)$: where $f(t)$ is an exciting component] obtained from a rotation detector, wherein the rotation detection signals [$\sin \theta \cdot f(t)$ and $\cos \theta \cdot (t)$] are guided to a multiplier and mutually operated with $\sin \phi$ and $\cos \phi$ obtained from the digital angle output ($\phi$), in order to obtain [$\sin \theta \cdot f(t) \times \cos \phi$]−[$\cos \theta \cdot f(t) \cdot \sin \phi$]=$\sin(\theta-\phi) \cdot f(t)$ as a first output signal, and the first output signal $\sin(\theta-\phi) \cdot f(t)$ is converted into a digital signal by positive/negative sign determination performed by a comparator when the first output signal $\sin(\theta-\phi) \cdot f(t)$ is synchronously detected to remove the exciting component $f(t)$ and to obtain a second output signal $\sin(\theta-\phi)$ as an error deviation $\epsilon$. The method is a method wherein the error deviation $\epsilon$ is input to a counter as a digital angular velocity signal $\omega(-\dot\phi)$ through a compensator to be counted, and a digital angle output ($\phi$) is obtained from the counter. The method is a method wherein, in a multiplier, sin and cos 10-bit multiplying D/A converters are used, and a 12-bit counter is used as the counter. The method is a method wherein the digital angle output ($\phi$) is fed back and input to the sin and cos 10-bit multiplying D/A converters through a sin ROM and a cos ROM, and non-linear characteristics are written in the sin ROM and the cos ROM. The method is a method wherein a DC bias current is applied to an output winding for outputting the rotation detection signals [$\sin \theta \cdot f(t)$ and $\cos \theta \cdot f(t)$] depending on rotation of a rotor of the rotation detector, and a disconnection detection signal having a voltage higher than the maximum voltage of the rotation detection signals [$\sin \theta \cdot f(t)$ and $\cos \theta \cdot f(t)$] from a differential amplifier when the output winding is disconnected. In addition, the method is a method wherein a phase difference between an exciting component included in the rotation detection signals $\sin \theta \cdot f(t)$ and $\cos \theta \cdot f(t)$ and an exciting signal of the rotation detector is detected, leading and trailing edges of the rotation detection signal component are detected to cause a reference signal guided to a synchronous detector to be synchronized with the exciting component included in the rotation detection signals.

DETAILED DESCRIPTION OF THE PREFERRED EMBODIMENTS

Preferred embodiments of a digital conversion method for an analog signal according to the present invention will be described below with reference to the accompanying drawings.

Figure 2:
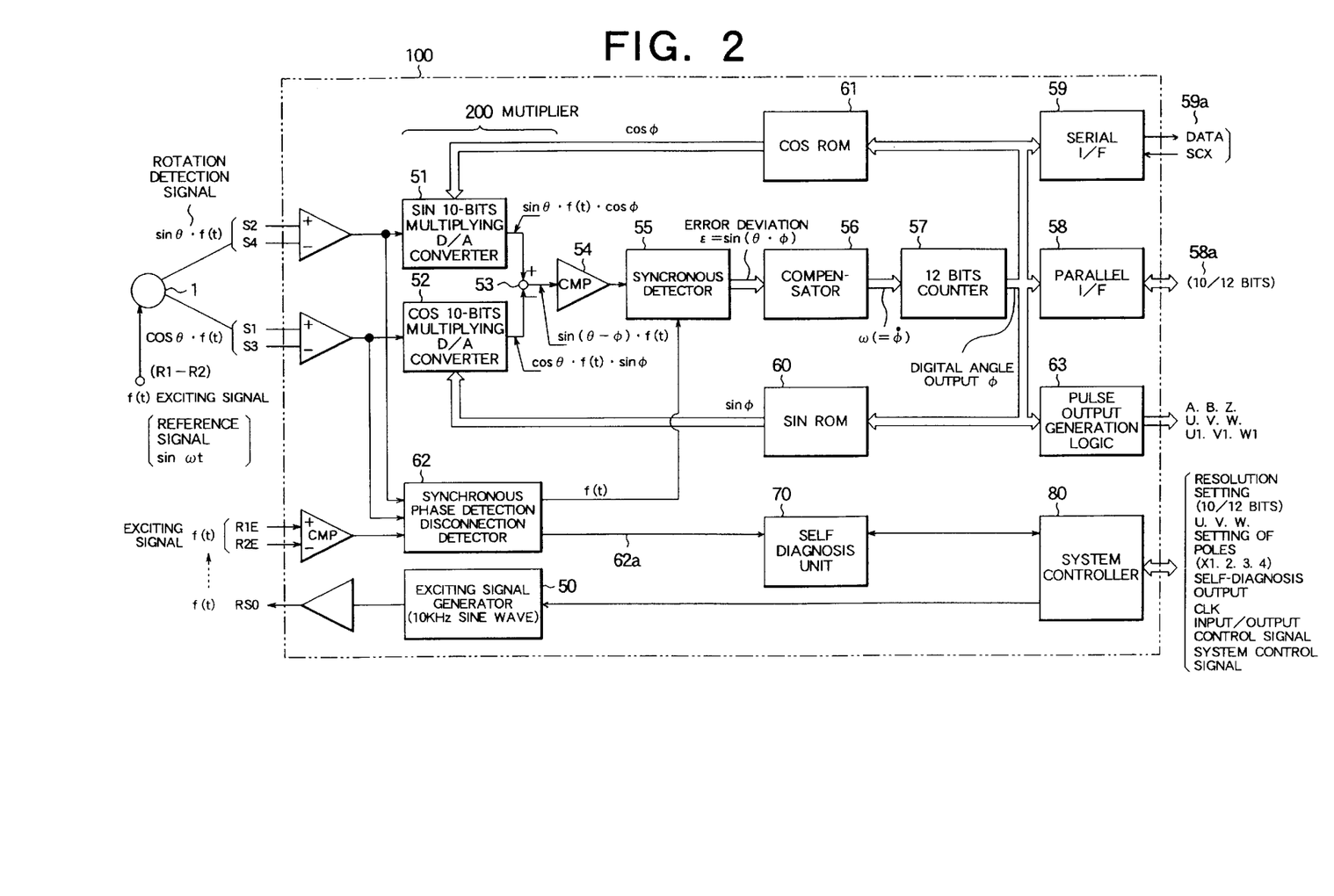
FIG. 2 is a block diagram of a digital conversion method for an analog signal according to the present invention.

FIG. 2 is a block diagram showing a digital tracking R/D converter to which the digital conversion method for an analog signal according to the present invention is applied.

In FIG. 2, reference numeral 1 denotes a rotation detector constituted by a resolver or a synchro. An exciting signal (component) f(t) serving as a reference signal sin ωt consisting of a 10-kHz sin wave from an exciting signal generator 50 of a digital tracking R/D (resolver/digital) converter 100 is applied to an exciting winding (not shown) of the rotation detector 1. Two-phase rotation detection signals sin θ·f(t) and cos θ·f(t) are input from a two-phase output winding (not shown) to a sin 10-bit multiplying D/A converter 51 and a cos 10-bit multiplying D/A converter 52 depending on rotation of a rotor (not shown).

Outputs sin θ·f(t)·cos φ and cos θ·f(t)·sin φ (as will be described later, sin φ and cos φ of a digital angle output φ are fed back and input to the converters 51 and 52 through a sin ROM 60 and a cos ROM 61, respectively) from the 10-bit multiplying D/A converters 51 and 52 are subtracted from each other {[sin θ·f(t)·cos φ]−[cos θ·f(t)·sin φ]=sin(θ−φ)·f (t)} by a subtractor 53 to obtain a first output signal sin(θ−φ)·f(t). This first output signal sin(θ−φ)·f(t) is subjected to positive/negative sign determination by a comparator 54 to be input to a synchronous detector 55. The first output signal is synchronously detected by a reference signal f(t) from a synchronous phase detection disconnection detector 62, an error deviation ε=sin(θ−φ) serving as a second output signal is counted by a 12-bit counter 57 through a compensator 56, and the digital angle output φ is output as a parallel output 58a through a parallel interface 58.

The digital angle output φ is output as a serial output 59a through a serial interface 59, and pulse outputs 63a having known A, B, and Z phases and U, V, and W phases required to control a motor or the like are output by a pulse output generation logic 63. At the same time, as described above, digital angle outputs φ are input to the sin ROM 60 and the cos ROM 61 in which required nonlinear characteristics are written in advance to output sin φ and cos φ, respectively. A multiplier (error deviation operation unit) 200 is constituted by the converters 51 and 52, the subtractor 53, and the comparator 54.

In addition, a disconnection detection signal 62a output from the synchronous phase detection disconnection detector 62 is determined by a self-diagnosis unit 70, and then input to a system controller 80. The system controller 80 is designed to perform signal setting or outputting such as resolution setting, setting of U, V, and W poles, self-diagnosis outputting, outputting of an input/output control signal, and outputting of a system control signal.

Figure 3:
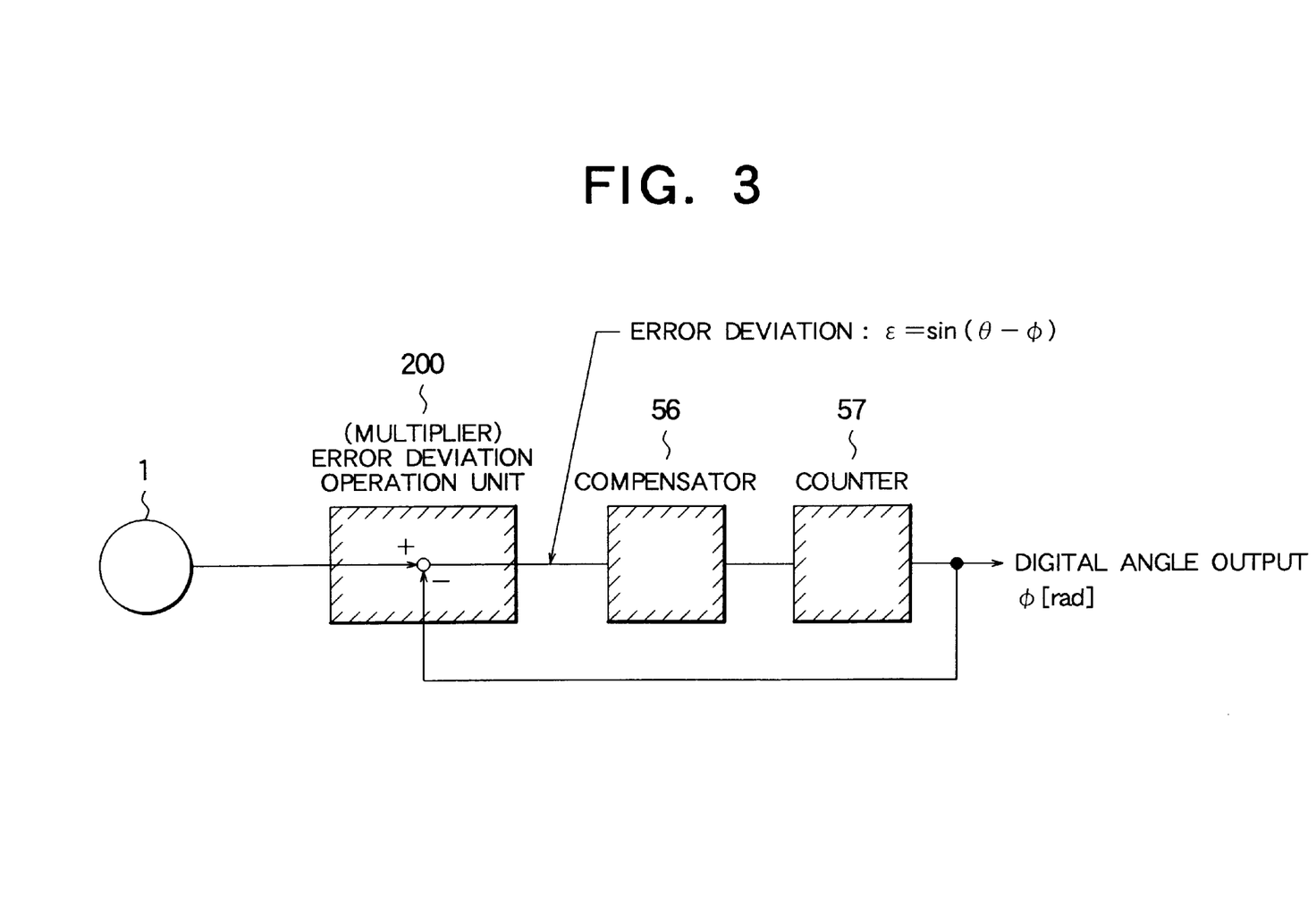
FIG. 3 is a schematic functional diagram showing functions in FIG. 2.

Before concrete explanation of the respective parts in FIG. 2, the basic function of the present invention will be described below. The basic function is shown in FIG. 3. More specifically, rotation detection signals sin θ·f(t) and cos θ·f(t) from the rotation detector 1 constituted by a resolver or a synchro are input to the error deviation operation unit 200 serving as a multiplier. The basic function is constituted by the compensator 56 for processing an obtained error deviation ε=sin(θ−φ) and the counter 57 serving as an object to be controlled.

Therefore, the rotation detection signals are given respectively:

$$\sin \theta \cdot f(t), \cos \theta \cdot f(t) \quad (1)$$

where θ is a rotation angle of the resolver 1, and f(t) is an exciting component.

In this case, the error deviation ε is calculated by the error deviation operation unit 200, tracking is performed to make the error deviation ε zero, thereby performing R/D conversion. More specifically, $$[\sin \theta \cdot f(t) \times \cos \phi] - [\cos \theta \cdot f(t) \times \sin \phi]$$

$$= (\sin \theta \cdot \cos \phi - \cos \theta \cdot \sin \phi) \cdot f(t)$$

$$= \sin(\theta - \phi) \cdot f(t) \quad (2)$$

In this equation (2), the term f(t) can be omitted by synchronous detection.

$$\text{Therefore, } \epsilon = \sin(\theta - \phi) \quad (3)$$

Figure 5:
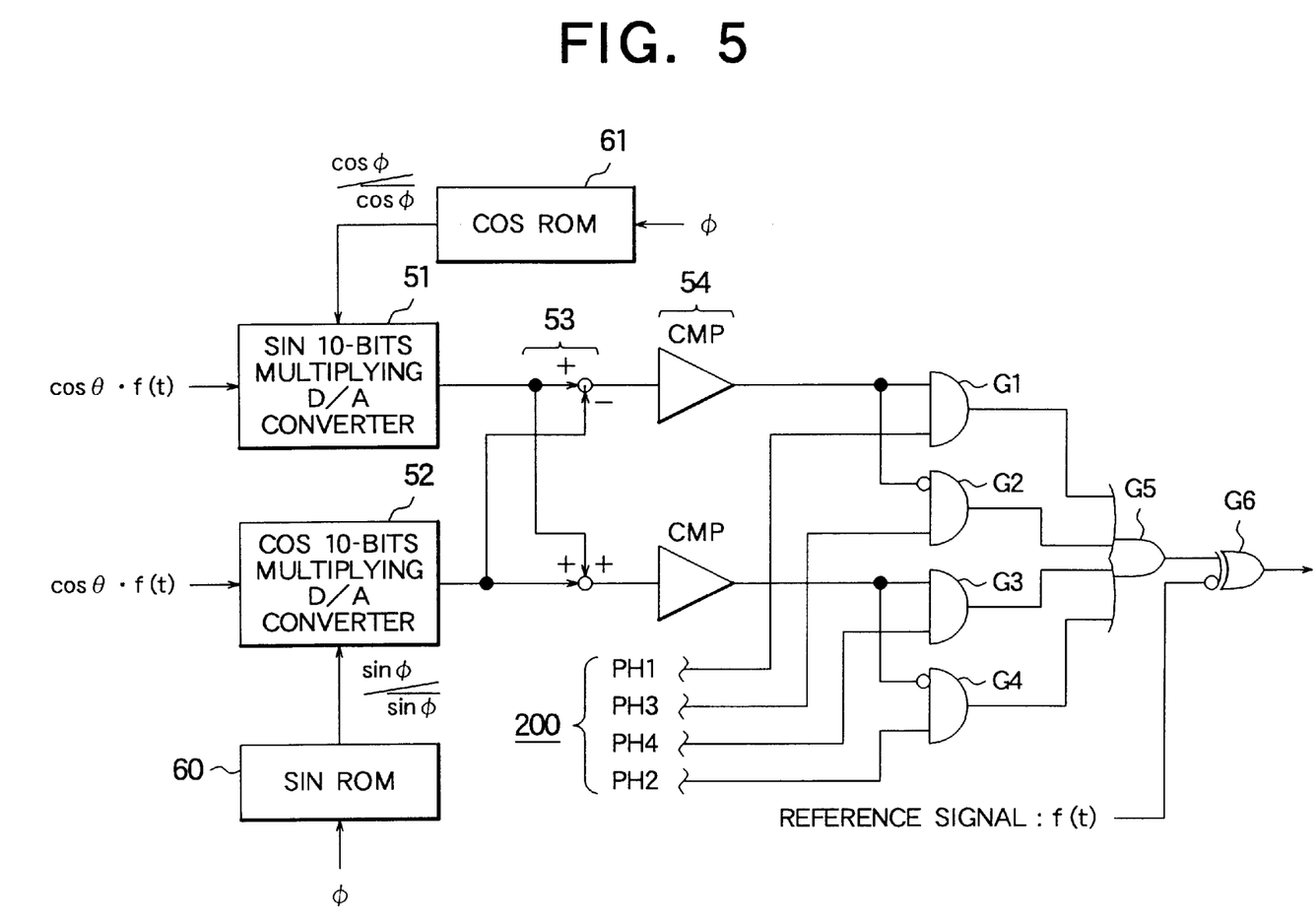
FIG. 5 is a block diagram of the error deviation operation in FIG. 2.

Thus, to establish ε=0 in the control system, θ=φ is obtained, and then the digital conversion is established. The basic function in the conventional method is the same as that in the method of the present invention. However, in the present invention, the value (analog quantity and size) of the error deviation itself is not considered. The function of the present invention is considerably different from the function of the conventional method in that the result of the equation (2) is only quantized (digitalized) by positive/negative sign determination using the comparator 54 (actually constituted by one pair of comparators as shown in FIG. 5).

In the embodiment shown in FIG. 2, the RID converter having a resolution of 12 bits, and 12-bit converters are not used, but 10-bit converters are used as the multiplying DIA converters 51 and 52 serving as sin and cos multipliers which perform an operation in the error deviation operation unit 200.

This is because, as will be described later, one rotation of 360° is divided into four phases each having 90°, and an operation process is repeated every 90° to simplify the hardware configuration of the circuit.

More specifically, the angle of 90° corresponds to 10 bits in a 12-bit RID converter. In addition, since digital processing is performed, degradation of performance can also be avoided even if the four-phase dividing method for simplifying the circuit.

Figure 4:
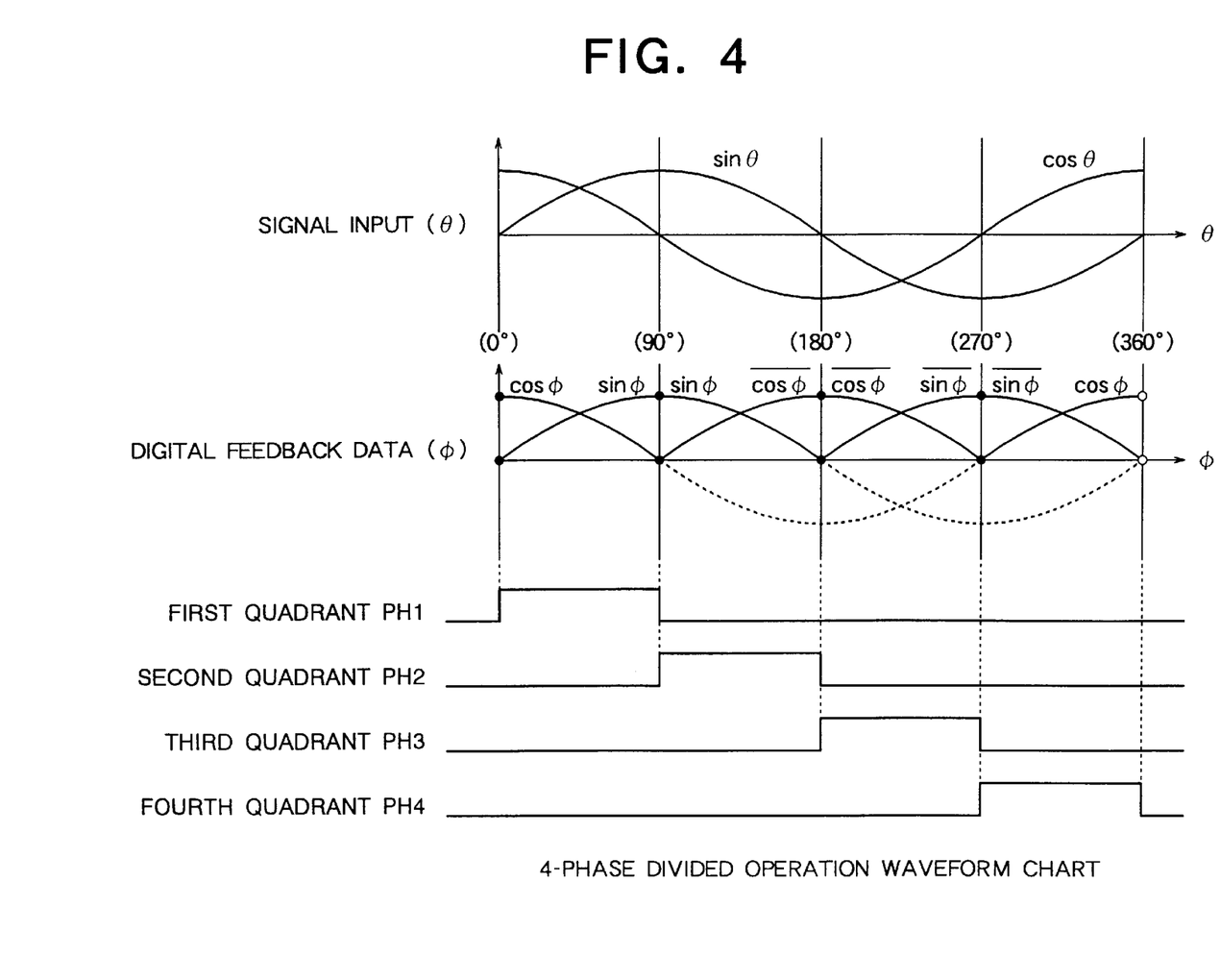
FIG. 4 is a 4-phase divided operation waveform chart of an error deviation operation in FIG. 2.

A method of calculating the error deviation ε by four-phase division will be described below. Operation waveforms obtained by the four-phase division are operations of quadrants PH1 to PH4 in FIG. 4. When the operations are expressed by a table, the first table of Table 1 is obtained.

TABLE 1

First Table

| Quadrant | Range | Error Deviation | Remark |
|---|---|---|---|
| I | 0°~90° | ε = sinθ · cosφ − cosθ · sinφ | PH1 |
| II | 90°~180° | ε = −(sinθ · $\overline{\cos\phi}$ + cosθ · sinφ) | PH2 |
| III | 180°~270° | ε = −(sinθ · $\overline{\cos\phi}$ − cosθ · $\overline{\sin\phi}$) | PH3 |
| IV | 270°~360° | ε = sinθ · cosφ + cosθ · $\overline{\sin\phi}$ | PH4 |

The error deviation operation circuit 200 is as shown in FIG. 5. The subtractor 53 and the comparator 54 shown in FIG. 2 are constituted by one pair of subtractors and one pair of comparators, respectively. In each of the comparators 54, positive/negative sign determination of an output from each of the subtractors 53, four-phase operations are sequentially performed by gates G1 to G4 in each of the quadrants PH1 to PH4, and an error deviation δ is obtained from a gate G6 to which the reference signal f(t) is input.

Figure 6:
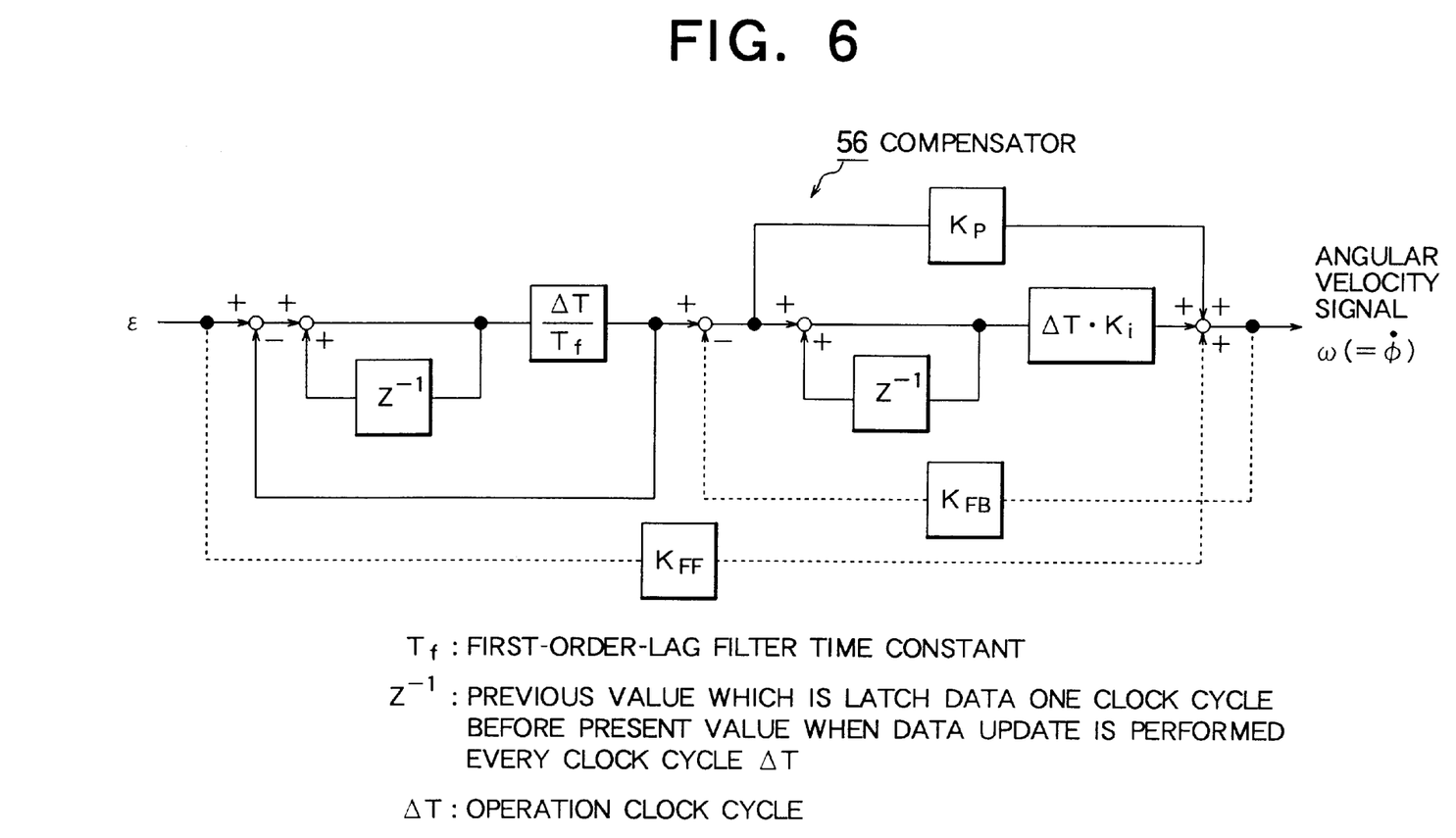
FIG. 6 is an equivalent circuit of a compensator in FIG. 2.

The compensator 56 is constituted like an equivalent circuit shown in FIG. 6. An object to be controlled by the digital tracking R/D converter according to the present invention is the counter 57, and the digital tracking R/D converter has primary integral characteristics. For this reason, in order to realize feedback control systems of two types as means for stably controlling the counter 57, serving as the object to be controlled, at a high speed and a high accuracy, the characteristics of the compensator 56 are given by PI (proportion+integration), and the compensator 56 is combined to a first-order-lag filter (Tf is a first-order-lag filter time constant). The compensator 56 in FIG. 6 is expressed by the following equation (4):

$$K(s)=(Kp+Ki/S)\times 1/(1+Tf\cdot S) \quad (4)$$

where:

S is Laplacean;

$1/(1+Tf\cdot S)$ is a first-order-lag filter; and $\Delta T$ is an operation-clock cycle.

Although KFB and KFF are not included in the equation (4), KFB is set to assure/improve stability in a static state, and KFF is set to assure/improve high-speed response. KFB and KFF are properly used in embodiments.

Figure 7:
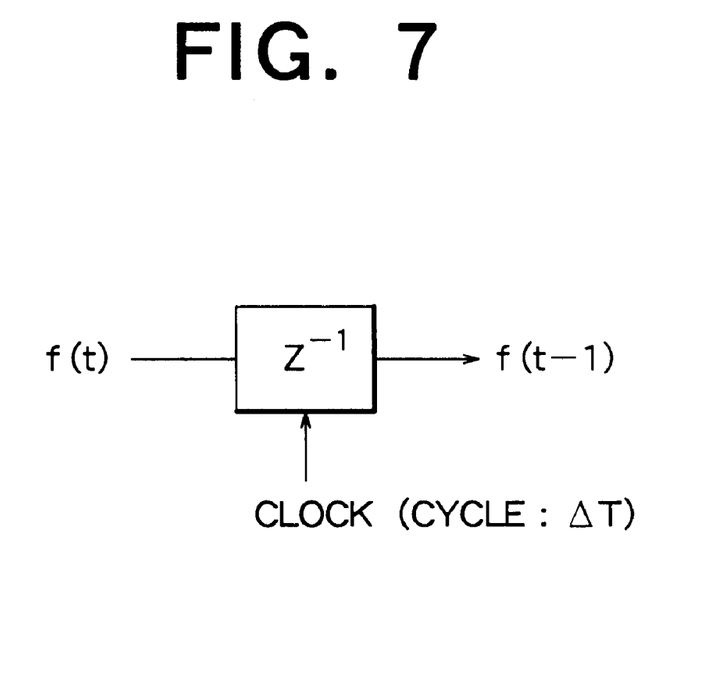
FIG. 7 is an equivalent circuit showing an operation of $Z^{-1}$ in FIG. 6.

$Z^{-1}$ represents a previous value which is latch data one clock cycle before a present value when data update is performed every clock cycle ($\Delta T$) as shown in FIG. 7. This state is as shown in FIG. 7.

Figure 8:
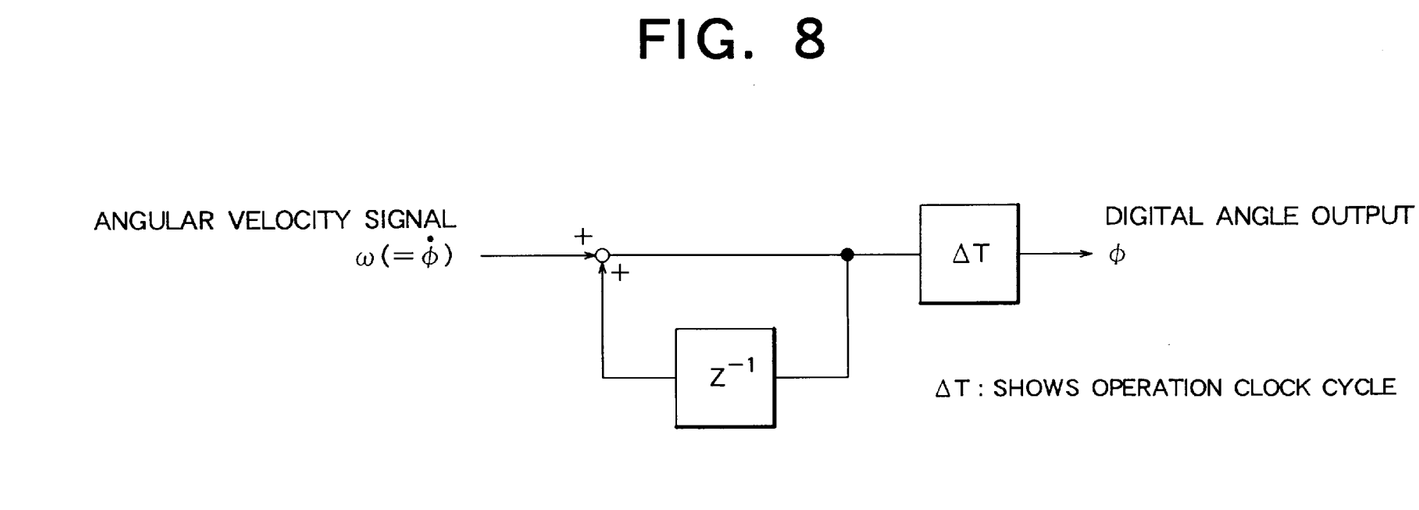
FIG. 8 is an equivalent circuit of a counter in FIG. 2.

The counter 57 serving as the object to be controlled has the 12-bit configuration as described above, and is constituted by a known adder and a known subtractor for integrating an angular velocity $\omega(=\phi\mathrm{dot})$ obtained by the compensator 56 of the previous stage. The counter 57 is represented by an equivalent circuit shown in FIG. 8, and performs a count operation by an operation clock cycle $\Delta T$.

Figure 9:
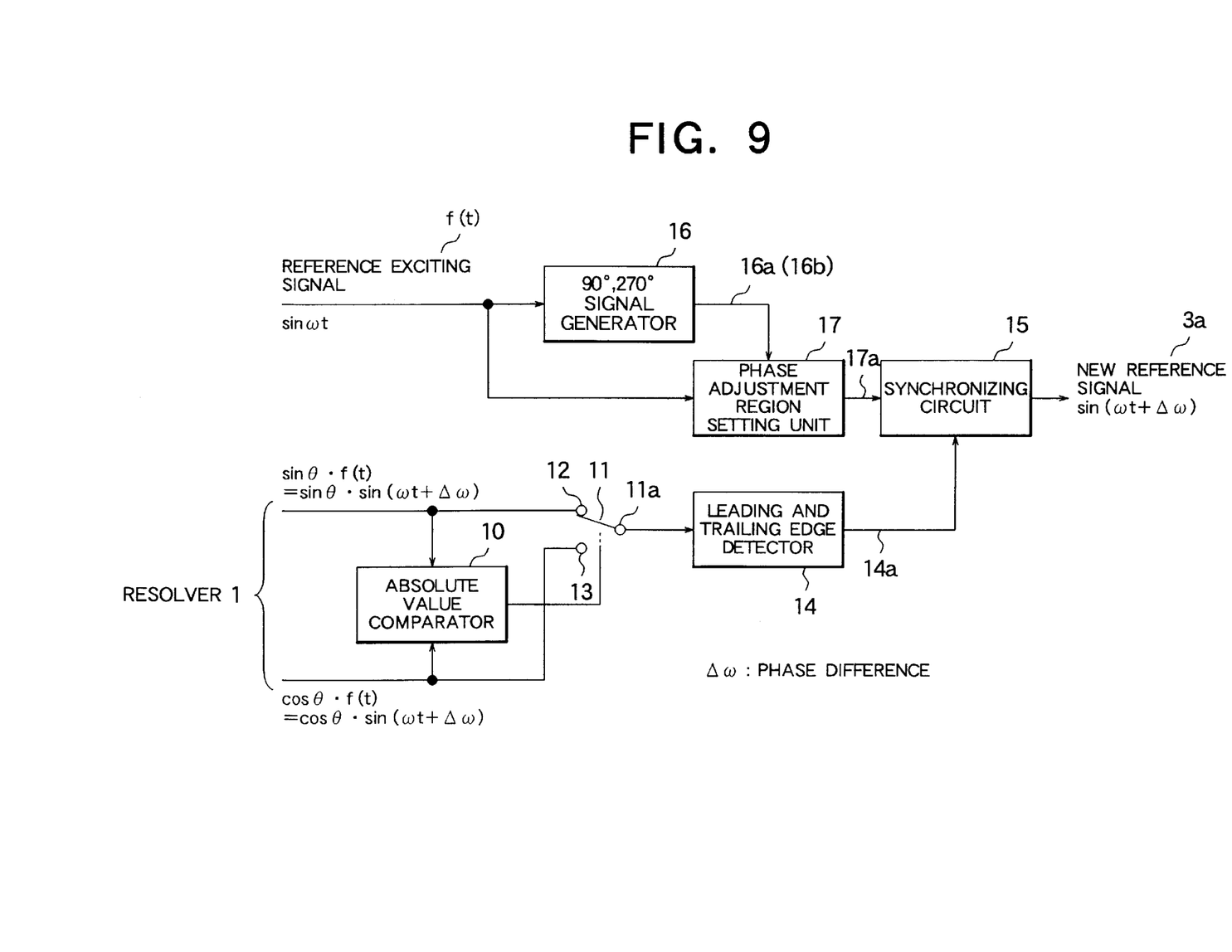
FIG. 9 is a block diagram showing another embodiment of the present invention.
Figure 10:
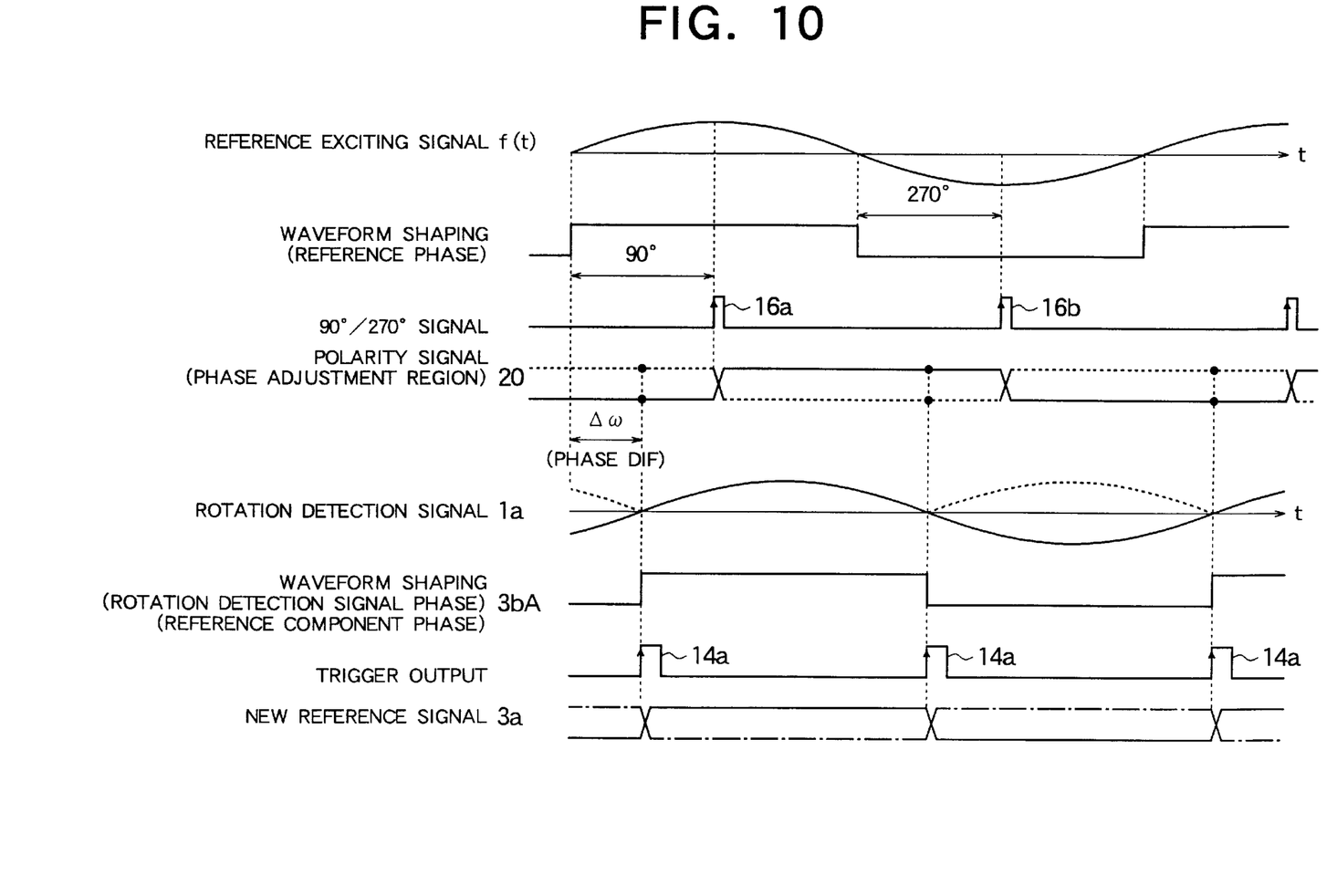
FIG. 10 is a waveform chart of the operation in FIG. 9.

As the method according to the present invention, a method of automatically correcting the phases between the rotation detection signals $\sin\theta\cdot f(t)$ and $\cos\theta\cdot f(t)$ shown in FIG. 9 and FIG. 10 can be applied. FIG. 9 is a block diagram, and FIG. 10 is a waveform chart.

In FIG. 9, rotation detection signals $\sin\theta\cdot f(t)$ and $\cos\theta\cdot f(t)$ consist of analog rotation detection signals having exciting components f(t) from the rotation detector 1. The rotation detection signals $\sin\theta\cdot f(t)$ and $\cos\theta\cdot f(t)$ are input to an absolute value comparator 10 and connected to first and second terminals 12 and 13 of a switch means 11.

An edge detector 14 for detecting leading and trailing edges are connected to a switching contact 11a of the switch means 11, and an edge output 14a from the edge detector 14 is input to a synchronizing circuit 15.

In this case, the exciting component f(t) of the rotation detection signal is given by $f(t)=\sin(\omega t+\Delta\omega)$ in consideration of a phase difference $\Delta\omega$ between the exciting component f(t) and a reference exciting signal, and the reference exciting signal is given by $f(t)=\sin\omega t$.

The reference exciting signal f(t) supplied to the rotation detector 1 is input to a 90°·270° signal generator 16 and a phase adjustment region setting unit 17.

An output 17a from the phase adjustment region setting unit 17 is input to the synchronizing circuit 15, and a new reference signal 3a obtained by correcting $\sin(\omega t+\Delta\omega)$ obtained by phase-shifting $\sin \omega t$ of the reference exciting signal f(t) by $\Delta\omega$ is obtained by the synchronizing circuit 15.

A case wherein automatic phase correction is actually performed will be described below.

As shown in FIG. 10, the waveform of the reference exciting signal f(t) is shaped to check a reference phase, and a 90° trigger 16a and a 270° trigger 16b are output from the 90°–270° signal generator 16. A polarity signal 20 is formed by the phase adjustment region setting unit 17, and a trigger output 14a and a phase difference $\Delta\omega$ of the rotation detection signals $\sin\theta\cdot f(t)$ and $\cos\theta\cdot f(t)$ are detected. When the waveforms of the rotation detection signals $\sin\theta\cdot f(t)$ and $\cos\theta\cdot f(t)$ are shaped, a rotation detection signal phase (reference component phase) 3bA is obtained.

The new reference signal 3a synchronized by the trigger output 14a is obtained. When the new reference signal 3a is used as an exciting signal, the rotation detection signals $\sin\theta\cdot f(t)$ and $\cos\theta\cdot f(t)$ and the new reference signal 3a can be synchronized with each other, and the phase difference $\Delta\omega$ generated by the rotation detector itself, a cable impedance, a change in temperature, and the like can be automatically corrected.

When the phase difference $\Delta\omega$ described above is automatically corrected, as a phase-adjustable range, a range of a phase difference of about ±90° can be used.

Figure 11:
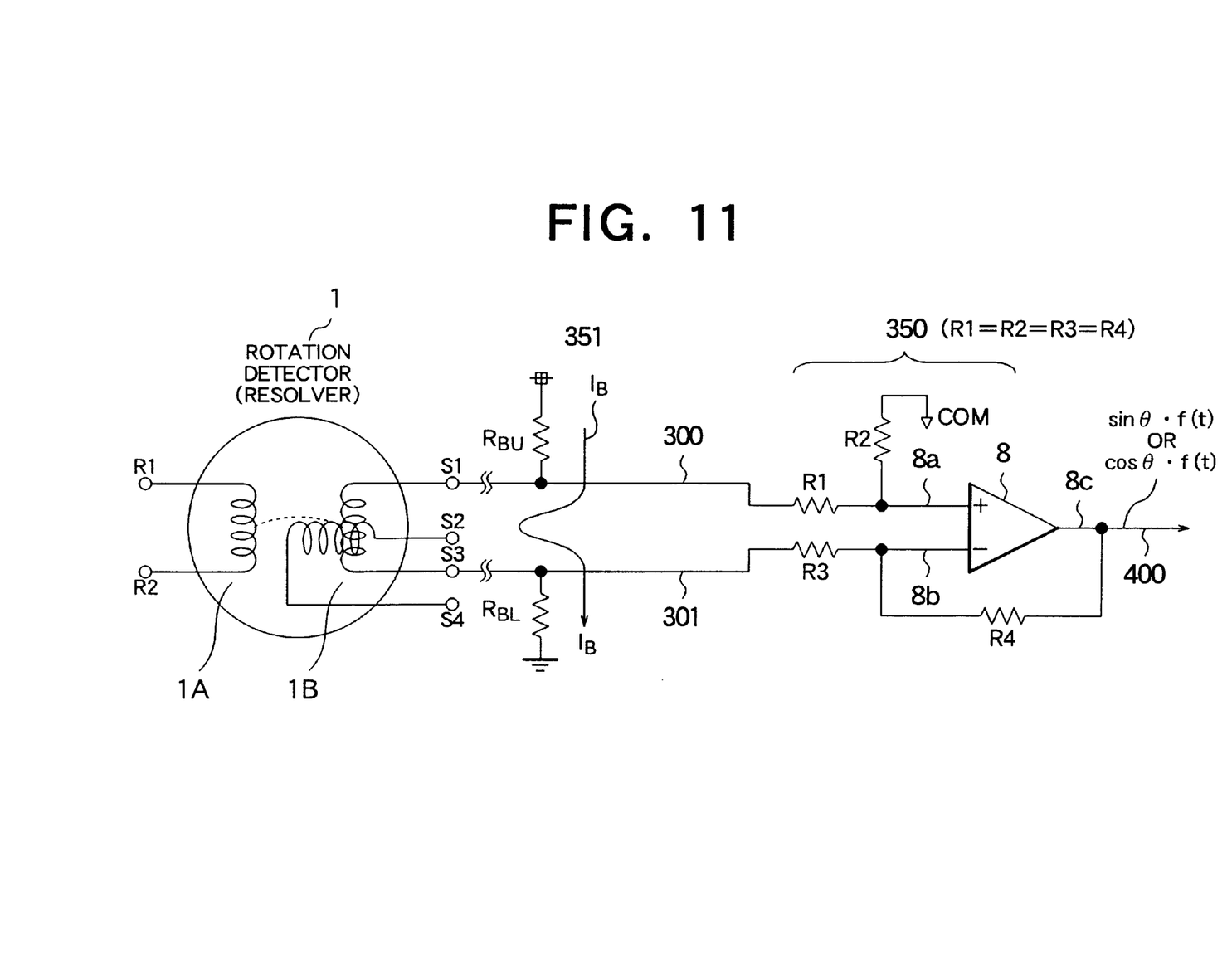
FIG. 11 is a diagram showing a main part of FIG. 2 according to the present invention.

The method shown in FIG. 11 represents a concrete example of a disconnection detection method of the rotation detector 1 shown in FIG. 2. More specifically, the rotation detector 1 in FIG. 11 constituted by a resolver constituted by an exciting winding 1A and an output winding 1B. Since the output winding 1B has two-phase outputs, the output winding 1B is constituted by one pair of windings. However, one winding will be omitted, and only the output winding 1B for outputting sin or cos signal will be described below.

An operation amplifier 8 is connected to input lines 300 and 301, connected to both the terminals of the output winding 1B, through first and second resistors R1 and R3, a common terminal COM is connected to a positive-phase terminal 8a of the operation amplifier 8 through a third resistor R2, and a fourth resistor R4 is connected between a negative-phase terminal 8b and an output terminal 8c. A known differential amplifier 350 is constituted by the operation amplifier 8 and the resistors R1 to R4 described above, so that the rotation detection signal $\sin\theta\cdot f(t)$ or $\cos\theta\cdot f(t)$ is output from the output terminal 8c.

Fifth and sixth resistors $R_{SU}$ and $R_{SL}$ having equal resistances are connected to the input lines 300 and 301, respectively, and a DC bias current $I_B$ from a DC power source 351 is applied to flow from the fifth resistor $R_{BU}$ to the sixth resistor $R_{BL}$ through the output winding 1B. Note that the DC bias current $I_B$ is set not to adversely affect the voltage level of the rotation detection signal $\sin\theta\cdot f(t)$ or $\cos\theta\cdot f(t)$.

An operation will be described below. When the output winding 1B is normal without being disconnected, the rotation detection signal $\sin\theta\cdot f(t)$ or $\cos\theta\cdot f(t)$ excited by the output winding 1B is output from the output terminal 8c through the differential amplifier 350. When the output winding 1B is disconnected, the DC bias current $I_B$ does not flow in the output winding 1B and the sixth resistor $R_{BL}$, and, at the same time, the voltage of the DC power source 351 is applied to the differential amplifier 350 to output a disconnection detection signal 400 in place of the rotation detection signal $\sin\theta\cdot f(t)$ or $\cos\theta\cdot f(t)$. The disconnection detection signal 400 has a voltage (for example, 5 V) higher than the voltage of the rotation detection signal $\sin\theta\cdot f(t)$ or $\cos\theta\cdot f(t)$. When the voltage level of the disconnection detection signal 400 is monitored by, a known window comparator or the like, the presence/absence of disconnection can be detected.

Since the digital conversion method for an analog signal according to the present invention has the configuration described above, the following advantages can be obtained.

More specifically, when $\sin(\theta-\phi)$ is calculated as a error deviation $\epsilon$, a first output signal $\sin(\theta-\phi)\cdot f(t)$ of the previous stage of the error deviation ϵ is converted into a digital signal by positive/negative sign determination performed by a comparator. The digital signal is input to a counter to obtain a digital angle output. For this reason, an R/D conversion process can be digitized, and improvements in conversion performances (stability, high-speed performance, and noise resistance) can be obtained.

When analog circuits are reduced in number, formation of a monolithic IC is advantaged, and products each having high reliability, a small size, and a low price can be manufactured (mass-production).

Since disconnection of a winding of a rotation detector can also be detected, an improvement in reliability can be achieved.

In addition, since a phase between a rotation detection signal and an exciting signal (reference signal) can be automatically corrected, detection accuracy can be improved and stabilized.

What is claimed is:

1. A digital conversion method for an analog signal for obtaining a digital angle output (φ) from rotation detection signals [sin θ·f(t) and cos θ·f(t): where f(t) is an exciting component] detected by a rotation detector, wherein the rotation detection signals [sin θ·f(t) and cos θ·f(t)] are guided to a multiplier and mutually operated with sin φ and cos φ derived from the digital angle output (φ) to obtain [sin θ·f(t)×cos φ]−[cos θ·f(t)×sin φ]=sin(θ−φ)·f(t) as a first output signal, and the first output signal sin(θ−φ)·f(t) is converted into a digital signal by positive/negative sign determination performed by a comparator when the first output signal sin(θ−φ)·f(t) is synchronously detected to remove the exciting component f(t) and to obtain a second output signal sin(θ−φ) as an error deviation ϵ.

2. A digital conversion method for an analog signal according to claim 1, wherein the error deviation ϵ is input to a counter as a digital angular velocity signal ω(=φdot) through a compensator to be counted, and a digital angle output (φ) is obtained from the counter.

3. A digital conversion method for an analog signal according to claim 2, wherein, in a multiplier, sin and cos 10-bit multiplying D/A converters are used, and a 12-bit counter is used as the counter.

4. A digital conversion method for an analog signal according to claim 3, wherein the digital angle output (φ) is fed back and input to the sin and cos 10-bit multiplying D/A converters through a sin ROM and a cos ROM, and non-linear characteristics are written in the sin ROM and the cos ROM.

5. A digital conversion method for an analog signal according to claim 4, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

6. A digital conversion method for an analog signal according to claim 4, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

7. A digital conversion method for an analog signal according to claim 3, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

8. A digital conversion method for an analog signal according to claim 3, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

9. A digital conversion method for an analog signal according to claim 2, wherein the digital angle output (φ) is fed back and input to the sin and cos 10-bit multiplying D/A converters through a sin ROM and a cos ROM, and non-linear characteristics are written in the sin ROM and the cos ROM.

10. A digital conversion method for an analog signal according to claim 9, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

11. A digital conversion method for an analog signal according to claim 9, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

12. A digital conversion method for an analog signal according to claim 2, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

13. A digital conversion method for an analog signal according to claim 2, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

14. A digital conversion method for an analog signal according to claim 1, wherein, in a multiplier, sin and cos 10-bit multiplying D/A converters are used, and a 12-bit counter is used as the counter.

15. A digital conversion method for an analog signal according to claim 14, wherein the digital angle output (φ) is fed back and input to the sin and cos 10-bit multiplying D/A converters through a sin ROM and a cos ROM, and nonlinear characteristics are written in the sin ROM and the cos ROM.

16. A digital conversion method for an analog signal according to claim/, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

17. A digital conversion method for an analog signal according to claim 15, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

18. A digital conversion method for an analog signal according to claim 14, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

19. A digital conversion method for an analog signal according to claim 14, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchroniized with the exciting component f(t) included in the rotation detection signals sin θ·f(t) and cos θ·f(t).

20. A digital conversion method for an analog signal according to claim 1, wherein the digital angle output (φ)is fed back and input to the sin and cos 10-bit multiplying DIA converters through a sin ROM and a cos ROM, and non-linear characteristics are written in the sin ROM and the cos ROM.

21. A digital conversion method for an analog signal according to claim 20, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

22. A digital conversion method for an analog signal according to claim 20, wherein a phase difference between an exciting component included in the rotation detection signals sin θ·f(t) and cos θ·f(t) and an exciting signal of the rotation detector is detected, leading and trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

23. A digital conversion method for an analog signal according to claim 1, wherein a DC bias current is applied to an output winding for outputting the rotation detection signals [sin θ·f(t) and cos θ·f(t)] depending on rotation of a rotor of the rotation detector, and a disconnection detection signal having a voltage higher than the maximum voltage of the rotation detection signals [sin θ·f(t) and cos θ·f(t)] are output from a differential amplifier when the output winding is disconnected.

24. A digital conversion method for an analog signal according to claim 1, wherein a phase difference between an exciting component included in the rotation detection signals sin θ·f(t) and cos θ·f(t) and an exciting signal of the rotation detector is detected, leading and-trailing edges of the exciting components f(t) of the rotation detection signals sin θ·f(t) and cos θ·f(t) are detected to cause a reference signal f(t) guided to a synchronous detector to be synchronized with the exciting component f(t) included in the rotation detection signals sin θ·f(t) and cos θ·f(t).

* * * * *